United States Patent
Chang et al.

(10) Patent No.: US 9,852,811 B2
(45) Date of Patent: Dec. 26, 2017

(54) DEVICE AND METHOD FOR DETECTING CONTROLLER SIGNAL ERRORS IN FLASH MEMORY

(71) Applicant: Macronix International Co., Ltd., Hsinchu (TW)

(72) Inventors: Kuen Long Chang, Taipei (TW); Ken Hui Chen, Hsinchu (TW); Su Chueh Lo, Hsinchu (TW); Chia-Feng Cheng, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 96 days.

(21) Appl. No.: 14/851,377

(22) Filed: Sep. 11, 2015

(65) Prior Publication Data

US 2016/0139983 A1 May 19, 2016

Related U.S. Application Data

(60) Provisional application No. 62/079,231, filed on Nov. 13, 2014.

(51) Int. Cl.
| | |
|---|---|
| *G06F 11/00* | (2006.01) |
| *G11C 29/52* | (2006.01) |
| *G06F 11/10* | (2006.01) |
| *G11C 29/02* | (2006.01) |
| *G11C 29/04* | (2006.01) |

(52) U.S. Cl.
CPC .......... *G11C 29/52* (2013.01); *G06F 11/1004* (2013.01); *G11C 29/02* (2013.01); *G11C 2029/0411* (2013.01)

(58) Field of Classification Search
CPC ......... G06F 11/1004; G11C 2029/0411; G11C 29/02; G11C 29/52
See application file for complete search history.

(56) References Cited

U.S. PATENT DOCUMENTS

| | | | |
|---|---|---|---|
| 7,617,437 B2 | 11/2009 | Moyer | |
| 2005/0081085 A1* | 4/2005 | Ellis | G06F 11/1044 714/6.2 |
| 2006/0095826 A1* | 5/2006 | Ruckerbauer | G06F 11/1044 714/748 |
| 2009/0235113 A1* | 9/2009 | Shaeffer | G06F 11/1004 714/5.11 |
| 2009/0327800 A1* | 12/2009 | Kim | G06F 11/1044 714/5.11 |

(Continued)

*Primary Examiner* — Joshua P Lottich
(74) *Attorney, Agent, or Firm* — Finnegan, Henderson, Farabow, Garrett & Dunner LLP

(57) ABSTRACT

In accordance with the disclosure, there is provided a memory device configured to implement an error detection protocol. The memory device includes a memory array and a first input for receiving a control signal corresponding to a command cycle. The memory device also includes a second input for receiving an access control signal during a command cycle and for receiving an error detection signal during the command cycle, wherein the error detection signal includes information corresponding to the access control signal. The memory device further includes control logic configured to verify the correctness of the access control signal by a comparison with the error detection signal and perform an operation on the memory array during the command cycle when the correctness of the access control signal is verified.

11 Claims, 14 Drawing Sheets

(56) References Cited

U.S. PATENT DOCUMENTS

| | | | |
|---|---|---|---|
| 2011/0191640 A1* | 8/2011 | Oh | G06F 12/00 714/54 |
| 2011/0219274 A1* | 9/2011 | Cho | G06F 11/00 714/708 |
| 2013/0080826 A1* | 3/2013 | Kondo | G11C 7/1006 714/6.2 |
| 2014/0047306 A1* | 2/2014 | Perego | G06F 11/10 714/799 |

* cited by examiner

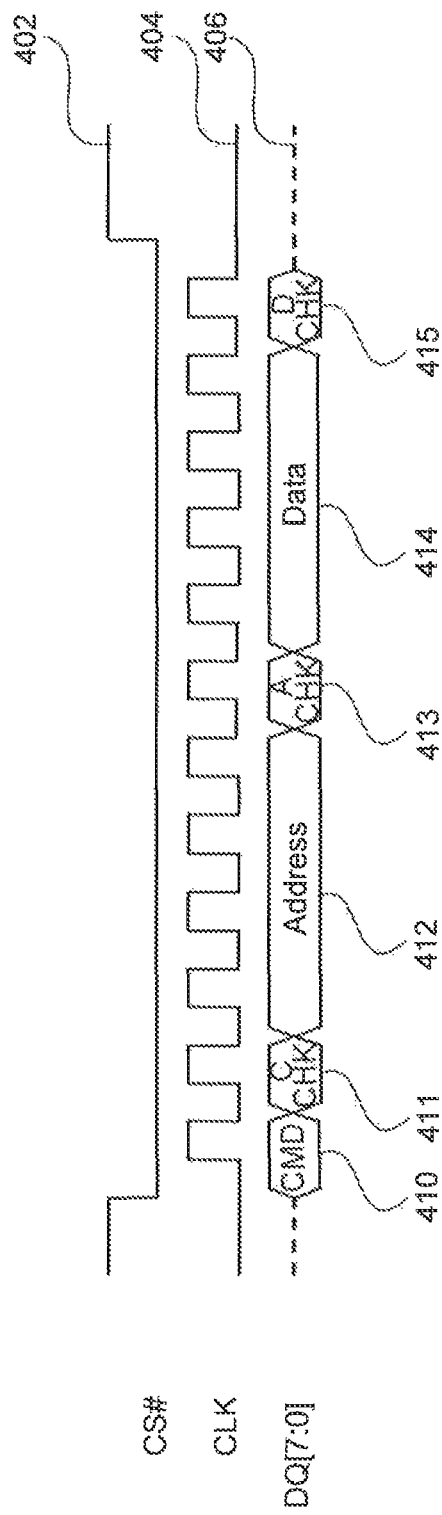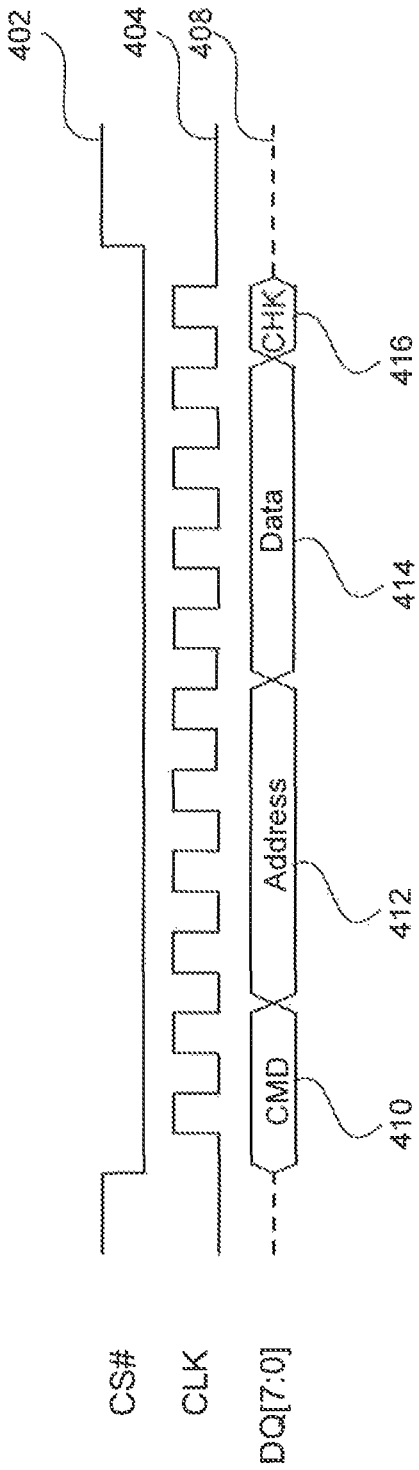

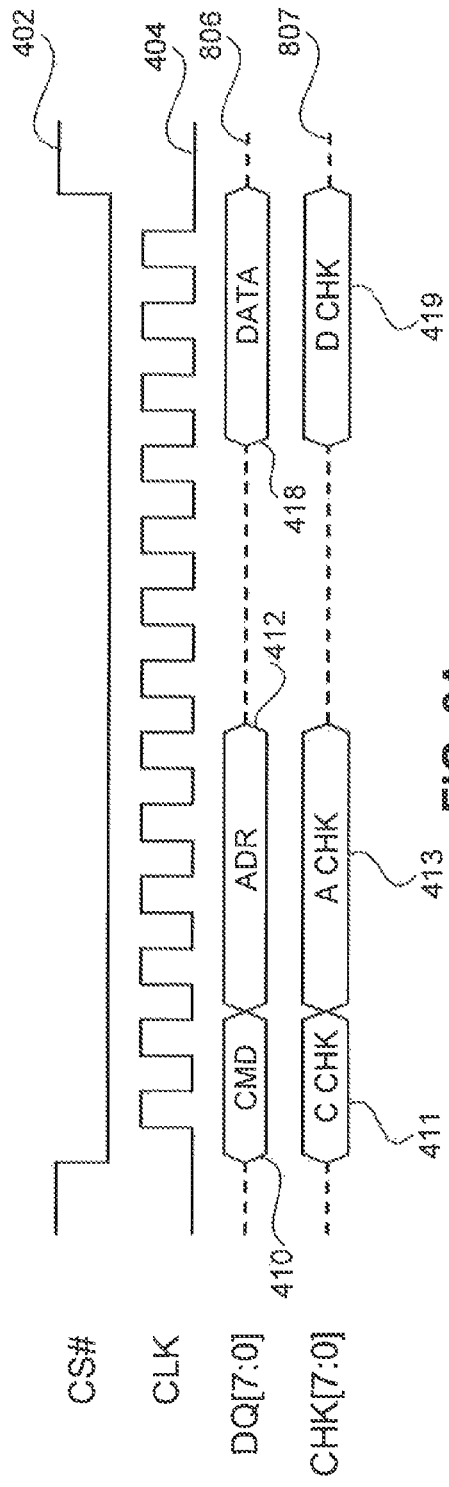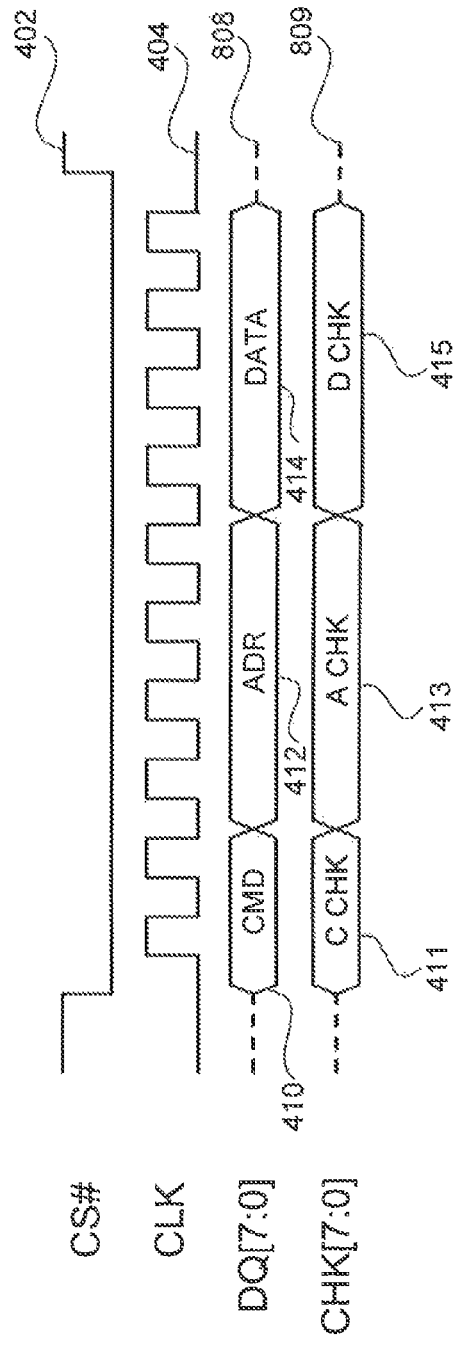

DEVICE AND METHOD FOR DETECTING CONTROLLER SIGNAL ERRORS IN FLASH MEMORY

BENEFIT CLAIM

This disclosure claims benefit under 35 U.S.C.§119(e) of U.S. provisional patent application No. 62/079,231 filed on Nov. 13, 2014, entitled "The Method To Check Input/Output Signal Integrity of Flash Memory." The aforementioned application is incorporated herein by reference in its entirety.

TECHNOLOGY FIELD

This disclosure relates to systems and methods for detecting errors in control and data signals between a memory controller and a memory device.

BACKGROUND

A memory device is usually controlled by a memory controller, which, by sending commands to the memory device, can control, for example, operations of the memory device, such as reading or writing of the memory device. The controller's commands and data may be sent to the memory device via a data bus including one or more input/output lines or communication paths connecting with an interface of the memory device. The interface may be configured for parallel or serial communications transmitted according to a particular protocol.

Examples of a "read" and "write" protocol that may be used for serial communications are shown in the timing diagrams of FIGS. 1A and 1B. As shown in FIG. 1A, a controller may output a chip select signal 102 as a chip select output (CS#), a clock signal 104 as a clock output (CLK), and an access control signal 106 as one or more data input/outputs (DQ[7:0]). In the examples shown, a "low" chip select signal 102 enables serial access to the memory device for a command cycle, which extends for a duration of a plurality of clock pulses of the clock signal 104. The access control signal 106 for a read command, shown in FIG. 1A, includes a plurality of command (CMD) bits 110, which may include, for example, a 2-byte command signaling the memory device to start a read operation. Following the command bits, the access control signal includes a plurality of address bits 120, which may include, for example, a 4-byte address indicating a read address of the memory device. Next, the example read protocol includes a dummy cycle 125, as part of the access control signal 106, which may extend for a plurality of clock pulses, such as the four clock pulses shown, to wait for the memory device to prepare the data for output. After the dummy cycle 125, the access control signal 106 includes a plurality of read data bits 130. In the example shown, the controller may strobe the CMD bits 110 and the address bits 120 at rising edges of the clock signal 104, whereas the memory device may strobe the read data bits 130 at falling edges of the clock signal 104. The chip select signal 102 is then driven "high" to end the read command cycle.

An exemplary access control signal 108 for a write command, as shown in FIG. 1B, includes a plurality of CMD bits 140 signaling the memory device to start a write operation. The CMD bits 140 are followed by a plurality of address bits 150 indicating a write address of the memory device. The access control signal 108 then includes a plurality of data bits 160 constituting data to be written to the memory device. After outputting the data bits 160 according to the write protocol, the controller then drives the chip select signal "high" triggering the embedded write operation at the memory device.

In the examples shown in FIGS. 1A and 1B, proper read/write operations depend, in part, on complete and accurate transmission of the access control signals 106/108 between the memory and controller. As memory density increases and throughput demands require ever higher operating frequencies, the potential for information transmitted in the access control signal to be incorrectly sent or received by the memory or the controller increases. For example, propagation delays and noise effects may distort the command, address and data bits transmitted over the data bus DQ[7:0] resulting in incorrect transfer of the access control signals between the memory device and controller. Thus, memory systems may benefit from a serial communication protocol including error detection capability.

SUMMARY

In accordance with the disclosure, there is provided a memory device configured to implement an error detection protocol. The memory device comprises a memory array and a first input for receiving a control signal corresponding to a command cycle. The memory device also comprises a second input for receiving an access control signal during a command cycle and for receiving an error detection signal during the command cycle, wherein the error detection signal includes information corresponding to the access control signal. The memory device further comprises control logic configured to verify the correctness of the access control signal by a comparison with the error detection signal and perform an operation on the memory array during the command cycle when the correctness of the access control signal is verified.

Also in accordance with the disclosure, there is provided a controller for controlling read and write operations on a memory array of a memory device. The controller is configured to provide an access control signal, to the memory device, including command information indicating an operation to be performed on the memory array, and address information indicating an address at which the operation is to be performed. The controller is also configured to generate an error detection signal including a plurality of command error detection bits corresponding to the command information and a plurality of address error detection bits corresponding to the address information. The controller is further configured to provide, to the memory device, the plurality of command error detection bits in a time multiplexed manner after providing the command information, and provide, to the memory device, the plurality of address error detection bits in a time multiplexed manner after providing the address information.

Additionally, there is provided a memory system comprising a controller for controlling read and write operations on a memory array of a memory device. The controller is configured to provide an access control signal, to the memory device, including command information indicating an operation to be performed on the memory array, and address information indicating an address at which the operation is to be performed. The controller is also configured to generate an error detection signal including a plurality of command error detection bits corresponding to the command information and a plurality of address error detection bits corresponding to the address information, and provide the error detection signal to the memory device. The system also includes a memory device comprising an input for receiving the access control signal and for receiving the error detection signal, and control logic configured to verify the correctness of the access control signal by a comparison with the error detection signal and perform an operation on the memory array when the correctness of the access control signal is verified.

A method is also provided for implementing an error detection protocol by a memory device. The method comprises receiving a chip select signal corresponding to a command cycle, and receiving an access control signal and an error detection signal during the command cycle, wherein the error detection signal includes information corresponding to the access control signal. The method also comprises comparing the error detection signal with the access control signal to verify the correctness of the received access control signal, and performing an operation on a memory array during the command cycle when the correctness of the access control signal is verified.

A memory device is also provided comprising a first input for receiving an access signal and a second input for receiving a detection signal. The memory device also comprises control logic configured to control the access signal when the detection signal is provided to the memory.

Features and advantages consistent with the disclosure will be set forth in part in the description that follows, and in part will be obvious from the description, or may be learned by practice of the disclosure. Such features and advantages may be realized and attained by means of the elements and combinations particularly set out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

BRIEF DESCRIPTION OF THE DRAWINGS

FIGS. 4A and 4B illustrate timing diagrams of exemplary serial communication write protocols.

FIGS. 8A and 8B illustrate timing diagrams of exemplary serial communication read and write protocols.

DETAILED DESCRIPTION OF THE EMBODIMENTS

Embodiments consistent with the disclosure include systems, devices and methods for detecting transmission errors over a data bus in a memory system. The disclosed embodiments are directed to a serial communications protocol providing an error detection signal used to verify the correctness of information provided in an access control signal transferred between a controller and a memory device. In some embodiments, an exemplary error detection signal is transferred using the same data bus line or lines used for transferring access control signal information between the controller and memory device. In other embodiments, an exemplary error detection signal is transferred using a dedicated line between dedicated pins respectively associated with the controller and memory device. In the disclosed embodiments, an error detection signal includes information corresponding to one or more of command, address or data information included in the access control signal.

Hereinafter, embodiments consistent with the disclosure will be described with reference to the drawings. Wherever possible, the same reference numbers will be used throughout the drawings to refer to the same or like parts.

Figure 1A:
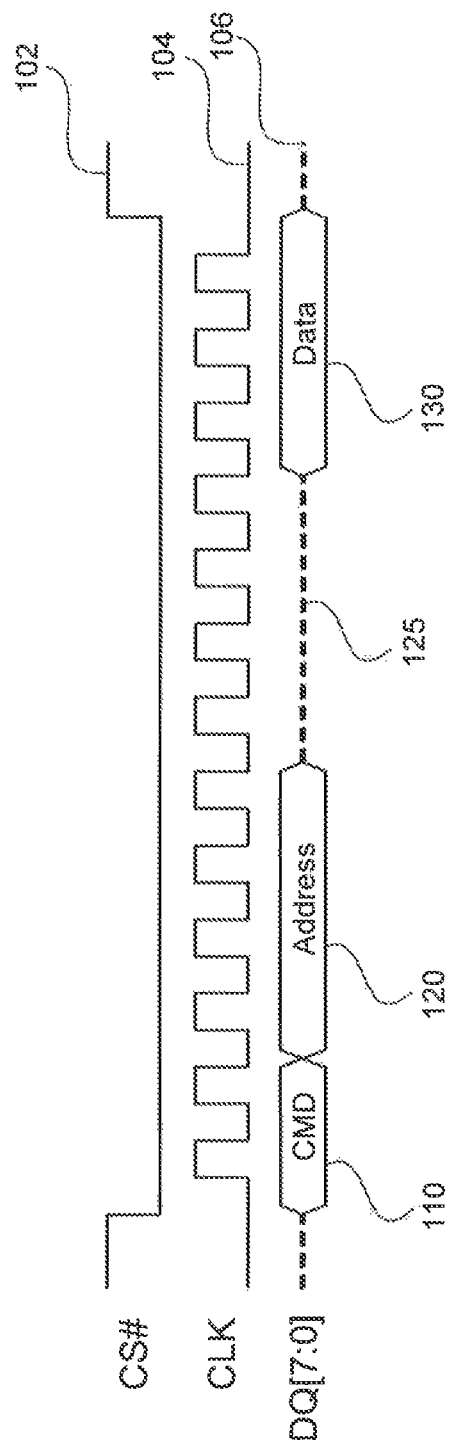
FIGS. 1A and 1B illustrate timing diagrams of conventional serial communication read and write protocols.
Figure 1B:
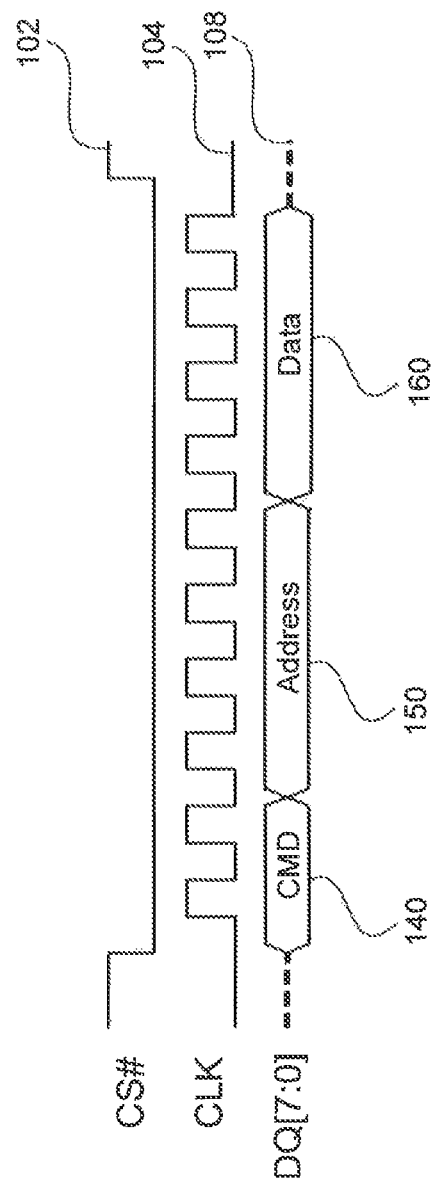
Figure 2:
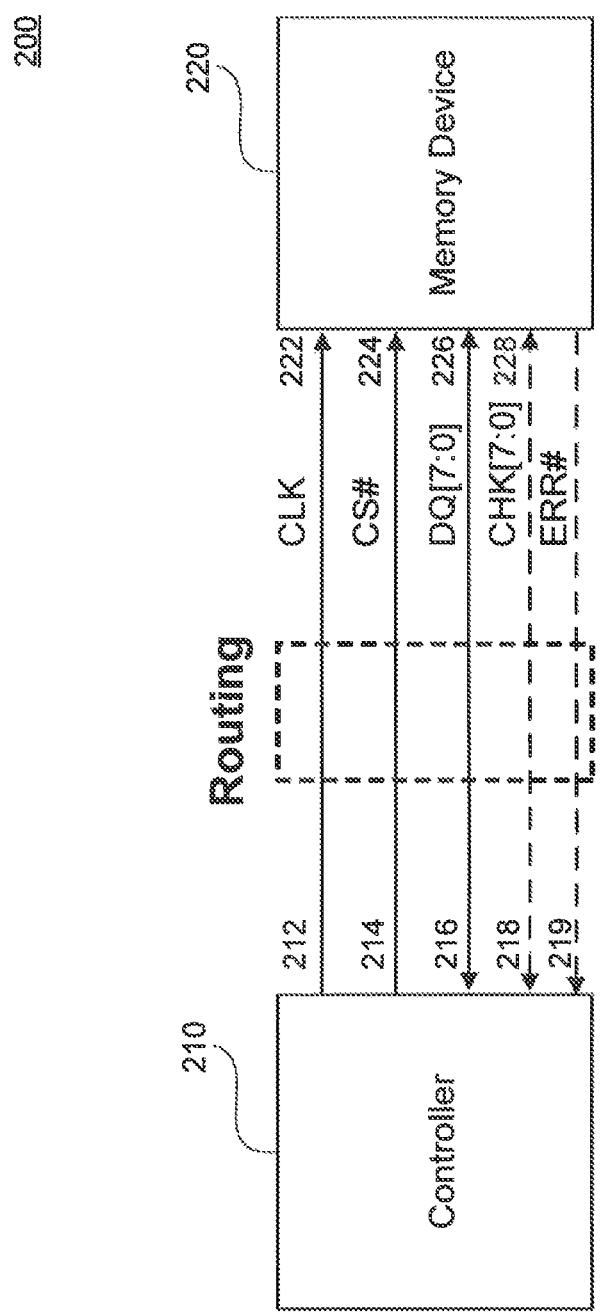
FIG. 2 shows an exemplary memory system 200 of the disclosed embodiments.

FIG. 2 schematically illustrates an exemplary memory system 200 according to the disclosed embodiments. Memory system 200 includes a memory controller 210 and a memory device 220. Memory controller 210 and memory device 220 each include an interface with a plurality of corresponding pins for receiving and transferring communication signals between each other. As shown, a first set of pins (212, 222) corresponds to clock output/input pins (CLK) for communicating a system clock signal for synchronizing signal communications between memory controller 210 and memory device 220. A second set of pins (214,224) corresponds to chip select (also known as slave select) output/input pins (CS#) for activating or enabling memory device 220 to communicate with memory controller 210. A third set of pins (216, 226) corresponds to data bus pins (DQ[7:0]) for transferring and receiving an access control signal to and from memory device 220. In some embodiments, a data bus coupled between pin sets 216 and 226 is configured to include a 1, 2 or 4 pin/line bus. The data bus may be configured to both transfer and receive control signals to and from memory device 220 using common pins or wires. Alternatively, the data bus may include distinct pins or wires separating signal input communications and output communications.

Some of the disclosed embodiments may also include a fourth set of pins 218/228 corresponding to error detection bus input/output pins (CHK[7:0]). In some embodiments, an error detection bus is coupled between input/output pins 218/228. The error detection bus may be configured with a similar number of pins or lines as the data bus DQ[7:0]. Some embodiments may further include a fifth set of pins 219/229 corresponding to error input/output pins (ERR#) for communicating an error signal from memory device 220 to memory controller 210 according to the disclosed embodiments.

Memory controller 210 is configured to control operations of memory device 220 consistent with embodiments of this disclosure. For example, memory controller 210 may include any number and combination of components (hardware or software) and circuitry configured to perform the methods of the disclosed embodiments directed to exemplary read and write protocols. For example, in addition to particular configurations of memory device 220 disclosed herein, such as in FIG. 5A described more fully below, memory controller 210 may also include one or more state machines, registers, error code generation circuitry and other logic circuitry for communicating with memory device 220 according to the disclosed embodiments. The logic circuitry may be dedicated circuitry or programmable gate array circuits, or may be implemented as a programmable processor or microprocessor with associated software instructions. Memory controller 210 may include any combination of these and other known components and may be provided as a single device such as a microcontroller or may be implemented as multiple independent devices. Any configuration of memory controller 210 as would be known to one of ordinary skill in the art as capable of performing the disclosed methods may be implemented.

In some embodiments, memory device 220 includes a serial-type NOR flash memory array. In other embodiments, memory device 220 may include other types of memory devices such as NAND flash memory, phase-change memory (PCM), resistive random-access-memory (RRAM) or any other type of volatile or non-volatile memory technology configured for serial communications. Additional aspects of memory device 220 are discussed in greater detail below.

Figure 3:
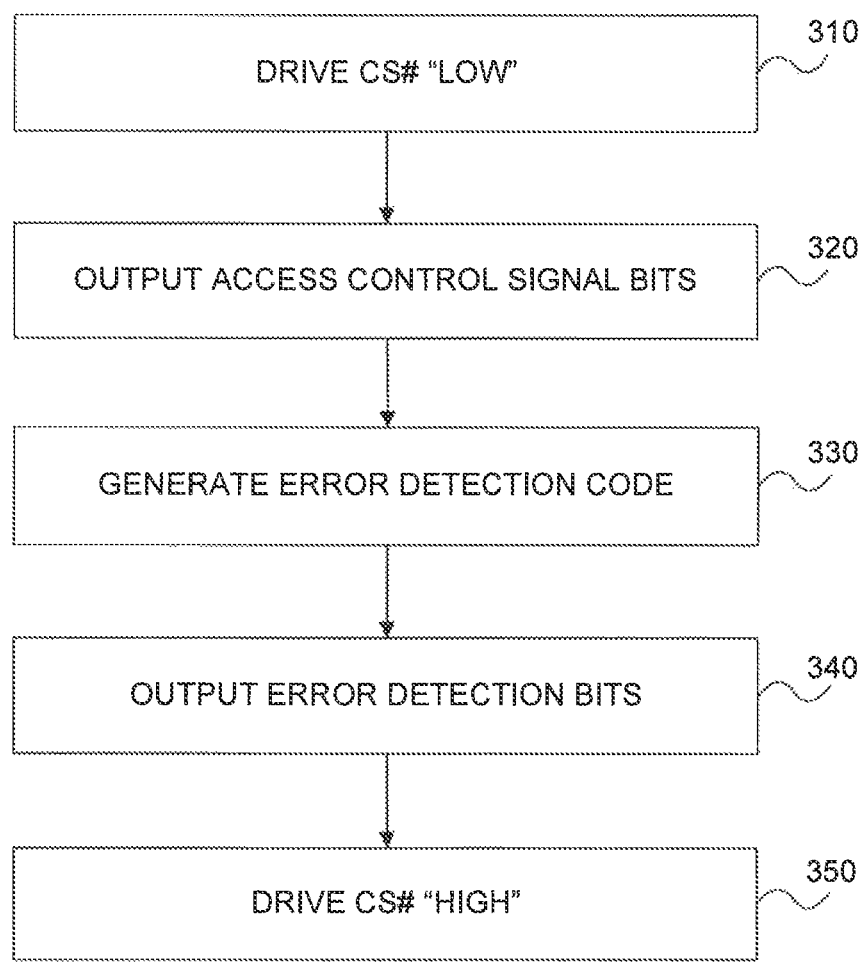
FIG. 3 is a flowchart showing a process according to an exemplary embodiment for controlling a memory device.

FIG. 3 is a flowchart of a process 300 performed by memory controller 210 for implementing aspects of exemplary read or write protocols according to the disclosed embodiments. FIGS. 4A and 4B illustrate timing diagrams of exemplary write protocols consistent with operations performed in process 300. At 310, memory controller 210 drives or outputs a "low" chip select signal at CS# output pin 214, for example. A "low" chip select signal (402 shown in FIGS. 4A, 4B) may activate memory device 220 or enable communication with memory device 220. Driving CS# output pin 214 "low" indicates the beginning of a command cycle. The chip select signal 402 remains "low" for the duration of the command cycle, as shown in FIG. 4A, for example. "Command cycle," as used in this disclosure, generally refers to a period corresponding to a predetermined number of successive clock pulses (404) over which an access control signal is communicated between memory controller 210 and memory device 220 according to a predetermined protocol. In the examples of this disclosure, the command cycle runs the duration of the period CS# signal 402 is low. "Access control signal," as used in this disclosure, generally refers to a signal communicated by memory controller 210 to memory device 220 including a plurality of information bits corresponding to a command code and an address. In some embodiments, an access control signal transmitted from memory control 210 to memory device 220 also includes a plurality of information bits corresponding to data to be written to a memory array of memory device 220. "Access control signal" may also generally include a plurality of information bits received by memory controller 210 from memory device 220, according to a read protocol, for example.

At 320, memory controller 210 outputs a plurality of access control signal bits to memory device 220 over data bus input/output pins 216 DQ[7:0]. As shown in FIGS. 4A and 4B, the access control signal bits include a first plurality of bits, such as CMD bits 410 corresponding to a command code, which signals memory device 220 to start an operation on a memory array of the memory device, such as a read or write operation, for example. A second plurality of access control signal bits correspond to address information 412 indicating an address of the memory array of the memory device 220 at which the operation is to be performed. A third plurality of access control bits correspond to data information 414, such as data to be written to the memory array at the address indicated by address information 412.

At 330, memory controller 210 generates an error detection code including a plurality of bits corresponding to the access control signal bits. With respect to the example shown in FIG. 4A, an error detection code is generated for each of the first, second, and third plurality of access control signal bits. For example, error detection bits constituting a first error detection code "C CHK" 411 are generated to correspond to the command information 410 of the first plurality of access control signal bits. Error detection bits constituting a second error detection code "A CHK" 413 are generated to correspond to the address information 412 of the second plurality of access control signal bits. Error detection bits constituting a third error detection code "D CHK" 415 are generated to correspond to the data information 414 of the third plurality of access control signal bits. In another embodiment, as shown in FIG. 4B, error detection bits constituting an error detection code "CHK" 416 are generated to correspond to a combination of the command information 410, address information 412, and data information 414. In the disclosed embodiments, the error detection bits may include a checksum, parity, or cyclic redundancy check (CRC) code, or bits corresponding to other error detection codes that enable memory device 220 to verify the correctness of the received access control signal bits.

At 340, memory controller 210 outputs a plurality of error detection bits corresponding to the error detection code generated at 330. In the disclosed embodiments, 330 and 340 are performed according to an exemplary serial communications protocol for enabling error detection of the access control signal information transferred between memory controller 210 and memory device 220 during a command cycle.

As shown in FIGS. 4A and 4B, the access control signal bits are output at 340 according to a particular protocol. According to a first "write protocol" 406 shown in FIG. 4A, memory controller 210 outputs the access control signal CMD bits 410 followed in succession by first error detection code "C CHK" 411. Memory controller 210 then outputs the address bits 412, followed in succession by second error detection code "A CHK" 413. Following output of error detection bits 413, memory controller 210 successively outputs data bits 414 and third error detection code "D CHK" 415.

According to a second "write" protocol 408 shown in FIG. 4B, memory controller 210 outputs, in succession, CMD bits 410, address bits 412 and data bits 414, followed by error detection code "CHK" 416. As detailed above, in this embodiment the "CHK" error detection code corresponds to a combination of CMD bits 410, address bits 412 and data bits 414. In another embodiment, not shown, an additional or other error detection code may be generated to correspond to a combination of CMD bits 410 and address bits 412, for example. Error detection bits associated with this code may be output following address bits 412. Other combinations may also be implemented according to the disclosed embodiments.

At 350 memory controller 210 drives CS# output pin 214 "high" indicating an end of the command cycle of the disclosed embodiments.

As shown in the examples of FIGS. 4A and 4B, an exemplary "write protocol" of the disclosed embodiments serially transfers access control signal information (410, 412, and 414) and error detection information (411, 413, and 415, or 416) to memory device 220 using data bus DQ[7:0]. In the example shown in FIG. 4A, the command cycle of exemplary write protocol 406 has a duration of twelve clock pulse cycles, in which each of the three error correction bit groups (411, 413, and 415) are transferred in a single clock cycle. Additionally, the command bits 410 are transferred in a single clock pulse cycle, while each of the address and data bit groups (412 and 414) are transferred in four clock cycles. For exemplary write protocol 408 of the example shown in FIG. 4B, the command bits 410 are transferred in two clock cycles, while each of the address and data bit groups (412 and 414) are again transferred in four clock cycles. In this embodiment, error detection bits 416 are transferred in a single clock cycle. The disclosed embodiments, however, are not limited by these examples. The number of clock pulse cycles for transmitting the various bit groups, as well as the length of the command, address, data and error detection bits, in any particular implementation, may depend on one or more of the width of data bus DQ[7:0] (i.e. 1, 2, or 4 line bus) and other command and address encoding schemes. Other variations and modifications of the above are contemplated by the present disclosure.

Figure 5A:
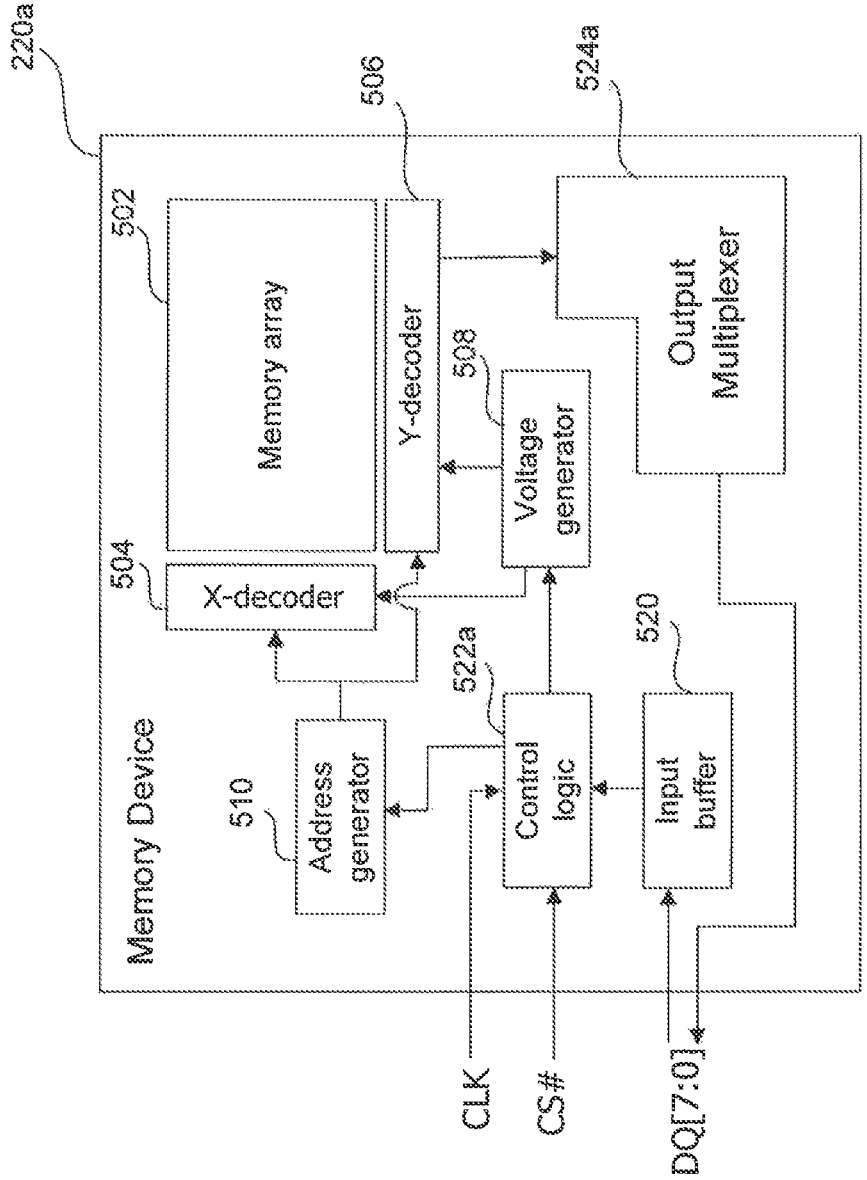
FIGS. 5A, 5B and 5C show an exemplary memory device according to an embodiment.

FIG. 5A illustrates an exemplary memory device 220a for implementing the serial communications protocols illustrated in FIGS. 4A and 4B. Memory device 220a includes a plurality of inputs and input/outputs to interface with memory controller 210 as discussed above with respect to FIG. 2. The inputs for interfacing with memory controller 210 are shown as a CLK input for receiving clock signal CLK, a CS# input for receiving the chip select signal, and one or more input/outputs corresponding to data bus DQ[7:0]. Memory device 220a may include a plurality of logic components configured as one or more buffers, state machines, registers, multiplexer/demultiplexer, error code generation circuitry and other logic circuitry for performing methods of the disclosed embodiments. The logic circuitry may be dedicated circuitry or programmable gate array circuits.

Exemplary memory device 220a includes a memory array 502 (such as a NOR type memory array), X-decoder circuitry 504, Y-decoder circuitry 506, voltage generator circuitry 508 and address generator circuitry 510. These components are configured to perform operations on memory array 502, as understood in the art. Detailed discussion of their functionality is therefore omitted.

Figure 5B:
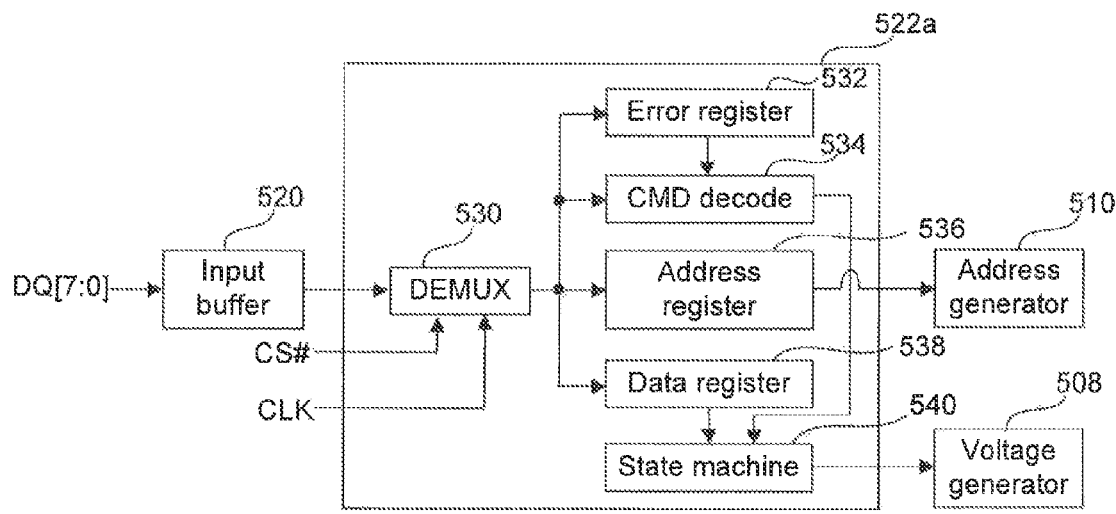

Memory device 220a also includes input buffer circuitry 520, control logic circuitry 522a, and output multiplexer circuitry 524a configured to perform operations associated with the disclosed serial communications protocols. Memory device 220a includes a plurality of communication paths, as shown, for electrically coupling the various components and circuitry for implementing the disclosed serial communications protocols. As shown, input buffer 520 interfaces with data bus DQ[7:0] to receive the access control signal bits and error detection signal bits detailed above. Input buffer 520 provides the received signal bits to control logic 522a based on the received clock and chip select signals. Additional aspects of control logic 522a are shown in FIG. 5B. Output multiplexer 524a also interfaces with data bus DQ[7:0] to output read data accessed from memory array 502 according to the disclosed embodiments. Additional functionality of output multiplexer 524a is described with respect to FIG. 5C.

As shown in FIG. 5B, control logic 522a includes a plurality of logic components and circuitry for performing aspects of the disclosed embodiments. For example, demultiplexing circuitry 530 is provided to separate command bits, address bits, data bits, and error detection bits time-multiplexed on data bus DQ[7:0], as described above with respect to FIGS. 4A and 4B. Demultiplexing circuitry 530 interfaces with an error register 532, command decode circuitry 534, address register 536, and data register 538 and outputs the demultiplexed bits to the corresponding circuitry. For example, received error detection signal bits are transferred to error register 532, command bits are transferred to command decode circuitry 534, address bits are transferred to address register 536, and data bits are transferred to data register 538.

Error register 532 is configured to perform a comparison of the received error detection bits and the corresponding access control signal bits according to a particular protocol. For example, in the example shown in FIG. 4A, error register 532 performs an error detection code generation operation on the received command bits 410 and performs a comparison of the result with the received command error detection code "C CHK" 411 to verify the correctness of the received command bits. Additional comparisons are performed with respect to the received address bits 412 and address error detection code "A CHK" 413, and received data bits 414 and data error detection code "D CHK" 415. Based on a result of one or more of these comparisons, error register 532 controls command decode circuitry 534 to output a signal to a state machine 540 indicating whether memory device 520 is to perform an operation in accordance with the received command, or ignore the command. If any of the above comparisons indicate that the command bits, address bits, or data bits of an access control signal were not received correctly by the memory device 220a, then error register 532 controls command decode circuitry 534 to effect an operating state of the state machine 540. State machine 540 is controlled, based on an input from command decode circuitry 534, to effectively ignore the received command when the all or part of an access control signal information is not received correctly. If all of the above comparisons indicate that the access control signal information was received correctly from memory controller 210, state machine 540 controls operation of voltage generator 508 to perform the received command.

Control logic 522a may also be similarly configured to perform the exemplary write protocol 408 shown in FIG. 4B and other variations contemplated by the present disclosure. For example, in some embodiments, error register 532 is configured to perform an error detection code operation on the combined command bits 410, address bits 412, and data bits 414 and compare the result with the received error detection code "CHK" 416.

Figure 6A:
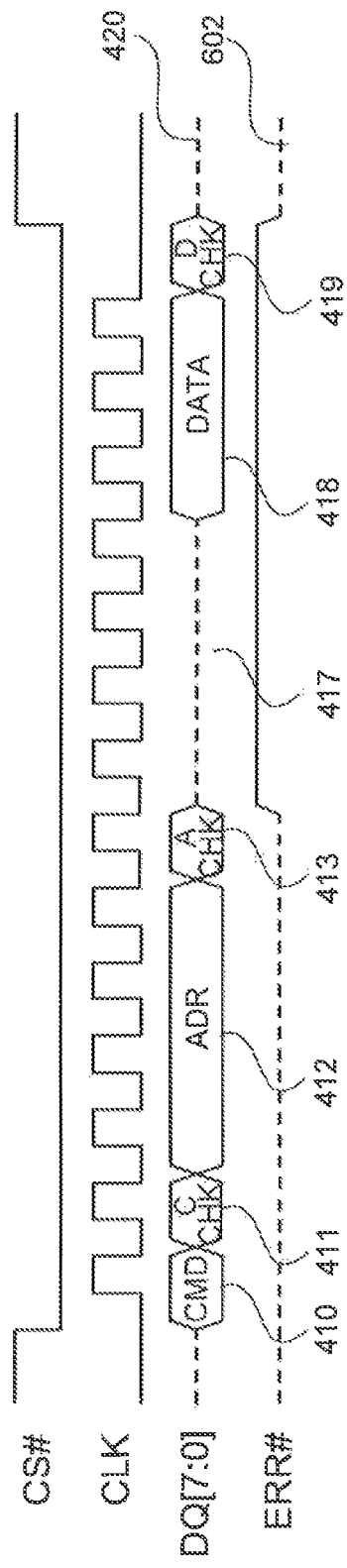
FIGS. 6A and 6B illustrate timing diagrams of an exemplary serial communication read protocol.

Although not shown with respect to the examples in FIGS. 4A and 4B, memory device 220a may also be configured to communicate read data according to an exemplary "read" protocol of the disclosed embodiments. FIG. 6A illustrates a timing diagram of an exemplary serial communication "read" protocol of the disclosed embodiments, aspects of which may be performed by memory device 220a. An exemplary read protocol 420 (FIG. 6A) of the disclosed embodiments is similar to write protocol 406 shown in FIG. 4A with respect to transfer of command bits 410 and address bits 412, as well as command error detection code "C CHK" 411 and address error detection code "A CHK" 413 by memory controller 210. Following output of address error detection code "A CHK" 413, the exemplary read protocol includes a dummy cycle 417 as part of access control signal 420, which may extend for a plurality of clock pulses to wait for the memory device 220 to prepare the read data for output. As part of the exemplary read protocol, memory device 220a performs the error detection comparisons described above to verify the correctness of the received read command bits 410 and address bits 412. If the error detection comparison verifies the correctness of the received access control information, state machine 540 is controlled to effect a read operation of the memory array 502 based on operation of voltage generator 508.

Figure 5C:
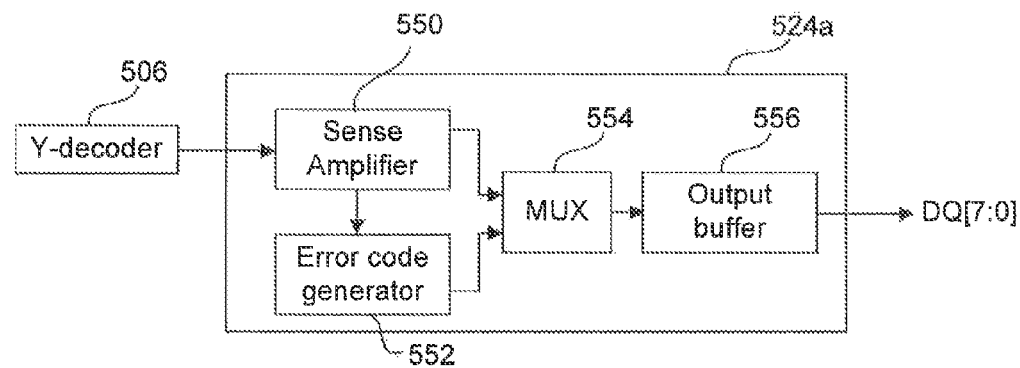

An exemplary output multiplexer 524a, as shown in FIG. 5C, may be configured to perform aspects of an exemplary "read" protocol. Output multiplexer 524a includes sense amplifier circuitry 550 that interfaces with Y-decoder circuitry 506 to sense read data bit values stored at a read address in memory array 502. Output multiplexer 524a also includes error code generator circuitry 552 configured to generate an error detection code according to the disclosed embodiments. Error code generator 552 may include a plurality of logic components and circuitry configured to generate an error detection code based on the read data received from sense amplifier 550. The error detection code includes a plurality of error detection bits constituting an error detection code "D CHK" 419 (FIG. 6A) corresponding to a checksum, parity, or cyclic redundancy check (CRC) code, or bits corresponding to other error detection codes that enable memory controller 210 to verify the correctness of the received read data bits from memory device 220a.

Output multiplexer 524a also includes multiplexing circuitry 554 configured to time multiplex error detection code "D CHK" 419 with read data bits 418, as shown in FIG. 6A. Output multiplexer 524a also includes an output buffer 556 for outputting the read data bits 418 and error detection code "D CHK" 419 onto data bus DQ[7:0] which, in the embodiment shown in FIG. 5A is a shared input/output bus.

In the embodiment described above with respect to FIGS. 4A, 4B, 5A, 5B, and 5C, memory device 220a can be configured to ignore an operation command received from memory controller 210 if it is determined that the received access control signal information bits were not received correctly by the memory device 220a based on a comparison with a received error detection code.

Figure 7A:
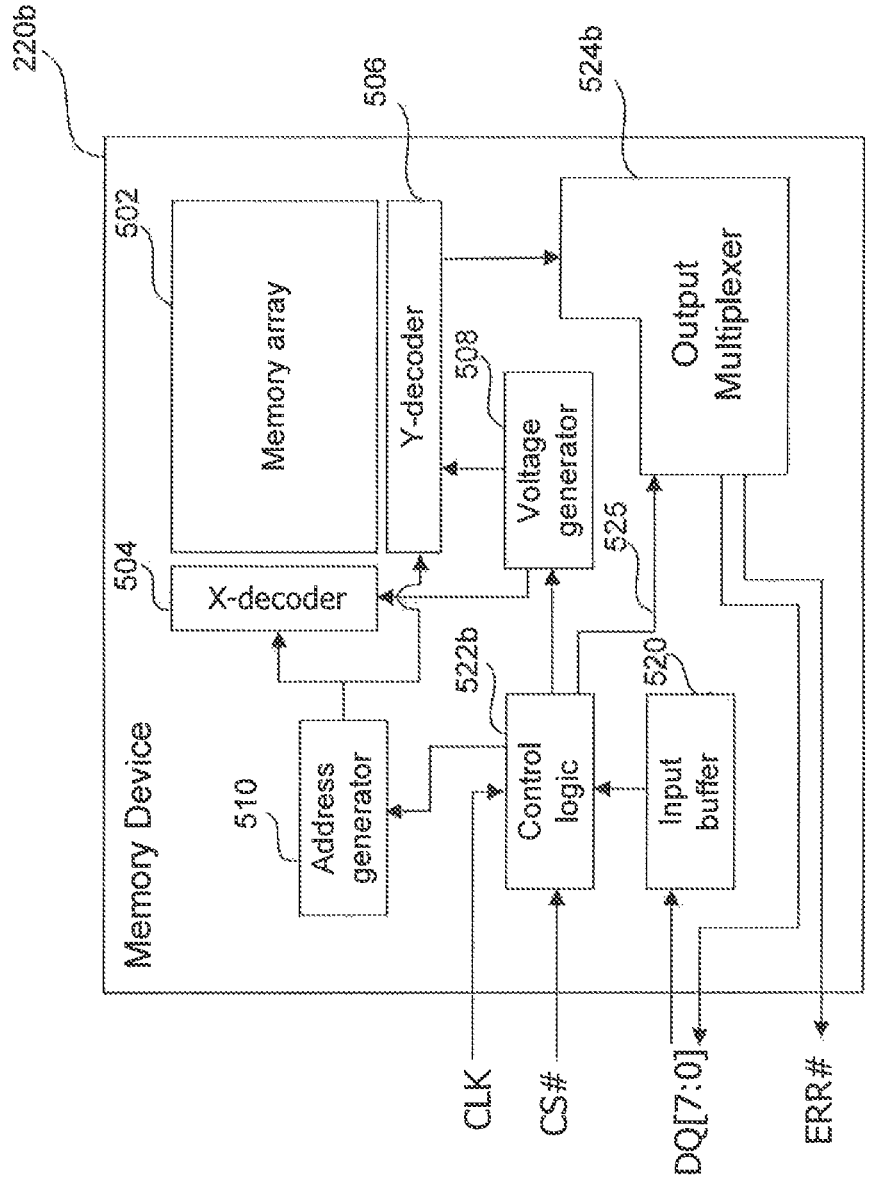
FIGS. 7A, 7B and 7C show an exemplary memory device according to another embodiment.

FIG. 7A illustrates an exemplary memory device 220b for implementing a further aspect of the exemplary communication protocol. More particularly, as shown with respect to FIG. 6A, the exemplary communications protocol includes the capability of exemplary memory device 220b to provide an error status signal 602 to memory controller 210 via ERR# input/output pins 219,229 shown in FIG. 2. Error status signal 602 is controlled by memory device 220b to indicate whether aspects of the access control signal have been correctly received by memory device 220b according to a particular communications protocol.

FIG. 6A illustrates operation of error status signal 602 according to the disclosed embodiments. As shown in FIG. 6A, an exemplary memory device, such as memory device 220b in FIG. 7A, is configured to provide error status signal 602 to memory controller 210 based on one or more error detection operations similar to those described above with respect to FIG. 5B. As shown in FIG. 6A, if memory device 220b verifies the correctness of the received access control signal information bits, such as command bits 410 and address bits 412, memory device 220b sets an output of the ERR# pin 229 to a "high" value or a value of '1.' Memory controller 210 senses the value at the ERR# input pin 219 to determine whether the access control signal information was correctly received by memory device 220b. Memory device 220b, according to an exemplary read protocol 420, then outputs read data bits 418 and data error detection code "D CHK" 419 to memory controller 210.

Figure 6B:
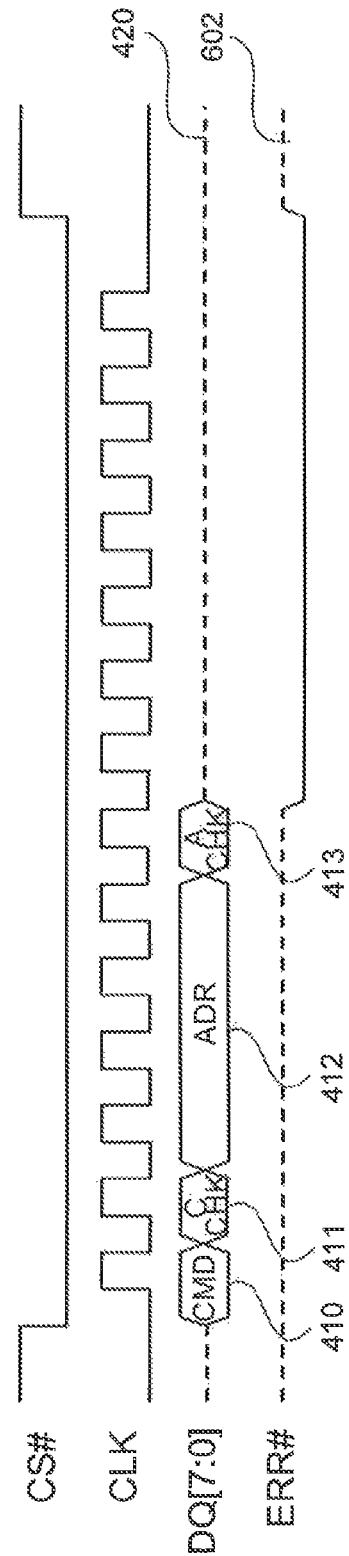

FIG. 6B illustrates a timing diagram of a similar exemplary "read" protocol, in which memory device 220b determines that the received access control signal information bits were not received correctly from memory controller 210. As shown, memory device 220b sets an output of ERR# pin 229 to a "low" value or a value of '0.' Memory controller 210 senses the value at ERR# input pin 219 to determine that the access control signal information was not received correctly by memory device 220b. Memory device 220b, according to exemplary read protocol 420, then ignores the read command signal as shown. Memory controller 210 may re-transfer the access control signal information to memory device 220b to perform the intended operation according to an exemplary communications protocol.

The examples shown with respect to FIGS. 6A and 6B may also be applied to an exemplary "write" protocol similar to that described above with respect to FIGS. 4A and 4B.

Figure 7B:
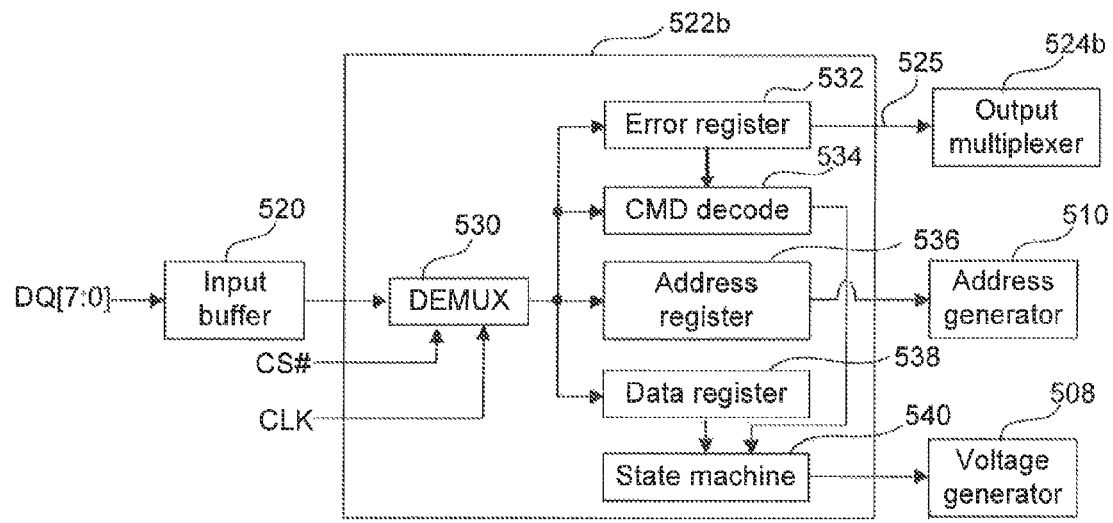

With reference to FIG. 7A, exemplary memory device 220b includes a configuration with many of the same components of memory device 220a. Particular to this embodiment, memory device 220b includes modified control logic circuitry 522b and a modified output multiplexer 524b configured to perform additional operations corresponding to output of error status signal 602 at ERR# output pin 229. Additionally, a communication path 525 is provided between control logic 522b and output multiplexer 524b to provide an error detection result determined by control logic 522b similar to that described above with respect to control logic 522a. FIG. 7B further illustrates this modification with respect to control logic 522b.

As shown in FIG. 7B, error register 532 includes communication path 525 coupled to output multiplexer 524b for providing an indication of the result of an error detection operation as similarly described with respect to FIG. 5B. The result of the error detection operation is then signaled to memory controller 210 based on operation of output multiplexer 524b, as described below with respect to FIG. 7C.

Figure 7C:
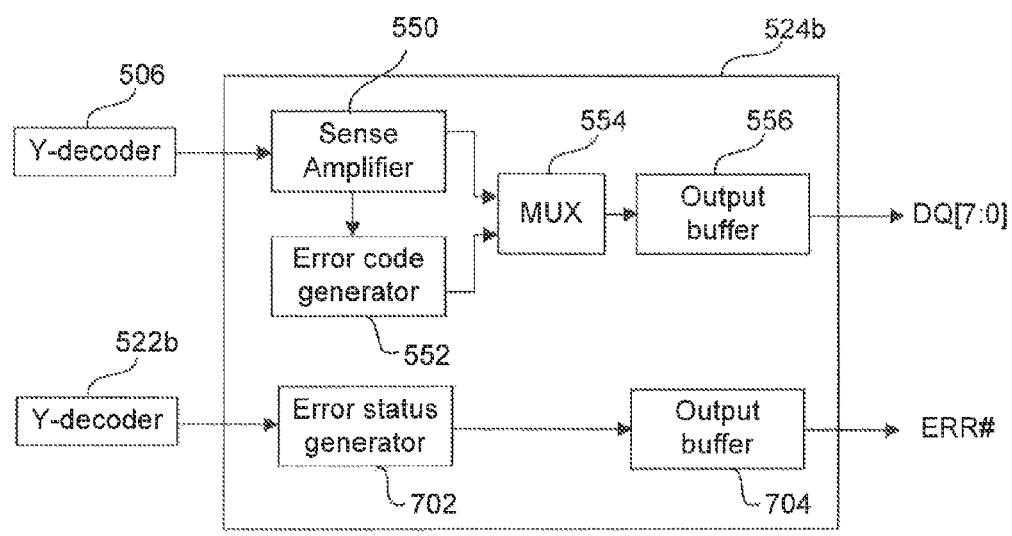

As shown in FIG. 7C, output multiplexer 524b includes many of the same components and configuration of output multiplexer 524a that perform similar functionality as that described above with respect to FIG. 5C. Additionally, output multiplexer 524b includes error status generator circuitry 702 and an output buffer 704 for providing an output of error status signal 602 at ERR# output pin 229. Error status generator 702 is configured to generate a status signal, such as a "high" or "low" signal to be output from output buffer 704 at ERR# output pin 229. For example, as shown in FIGS. 6A and 6B, a "high" error status signal 602 indicates that correctness of received access control signal information has been verified, whereas a "low" error status signal 602 indicates that the received access control signal information was not received correctly.

In the above-described embodiments of memory devices 220a and 220b, illustrated in FIGS. 5A and 7A, respectively, memory controller 210 and memory devices 220a, 220b time multiplex error detection signal information with access control signal information on a shared data bus DQ[7:0]. These embodiments are advantageous because they limit complexity of the memory device and the implemented architecture by sharing common data bus input/output lines. Other embodiments, however, may be implemented according to an exemplary communication protocol for transferring an error detection signal on a dedicated error detection bus CHK[7:0]. As described with respect to FIG. 2, error detection bus CHK[7:0] may include input/output pins 219, 229 for providing communications between memory controller 210 and memory device 220.

FIGS. 8A and 8B illustrate timing diagrams of exemplary read and write protocols, respectively, according to some embodiments. As shown in FIG. 8A, an exemplary read protocol includes implementation of an additional error detection signal 807, which is generated based on access control signal 806, similar to the above disclosed embodiments. For example, command error detection code "C CHK" 411 is generated according to an error detection protocol based on command bits 410, address error detection code "A CHK" 413 is generated according to the error detection protocol based on address bits 412, and read data error detection code "D CHK" 419 is generated based on read data bits 418, as similarly described above with respect to FIG. 6A. As shown in FIG. 8B, write data error correction code "D CHK" 415 is generated according the error detection protocol based on write data bits 414, as similarly described above with respect to FIG. 4A. As shown in FIGS. 8A and 8B, the exemplary error detection signals 807 and 809 are transferred between memory controller 210 and a memory device according to similar timing as the exemplary read access control signal 806 and write access control signal 808.

Figure 9A:
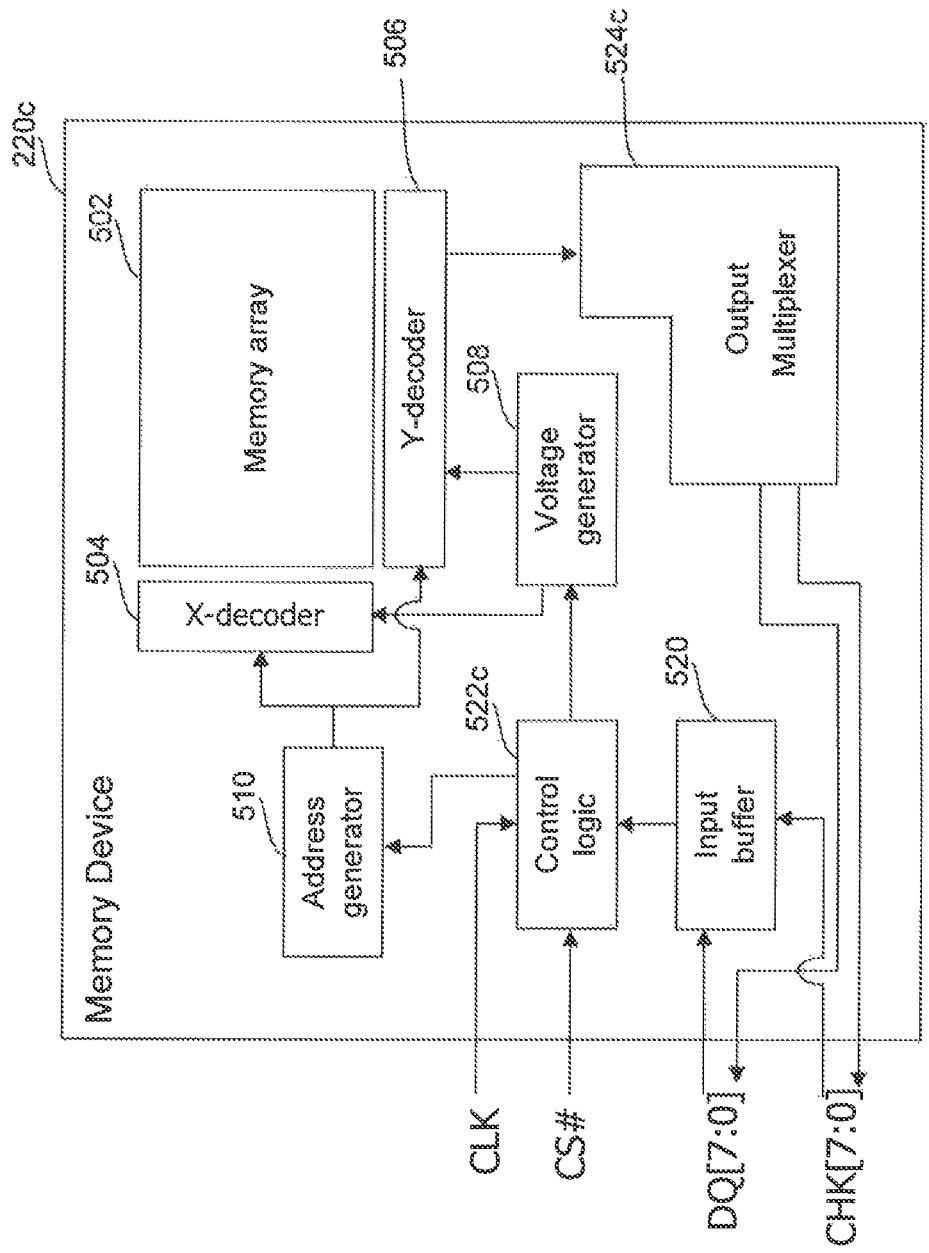
FIGS. 9A, 9B, and 9C show an exemplary memory device according to another embodiment.

FIG. 9A illustrates an exemplary memory device 220c according to another embodiment for implementing the communication protocols illustrated in FIGS. 8A and 8B. Memory device 220c includes many of the same components and functionality as memory devices 220a and 220b, with certain modifications particular to this embodiment. As shown, memory device 220c interfaces with an error detection bus CHK[7:0] for receiving an error detection signal according to an exemplary embodiment. Accordingly, input buffer 520 of memory device 220c is modified to include a communication path with the error detection bus CHK[7:0]. Control logic circuitry 522c is also modified to accommodate the additional error detection signal information received from error detection bus CHK[7:0]. Additional details of control logic circuitry 522c are described below with respect to FIG. 9B. Output multiplexer 524c, of memory device 220c is also modified to include a communication path with error detection bus CHK[7:0] to output an error detection signal according to the exemplary embodiments. Additional details of output multiplexer 524c are described below with respect to FIG. 9C.

Figure 9B:
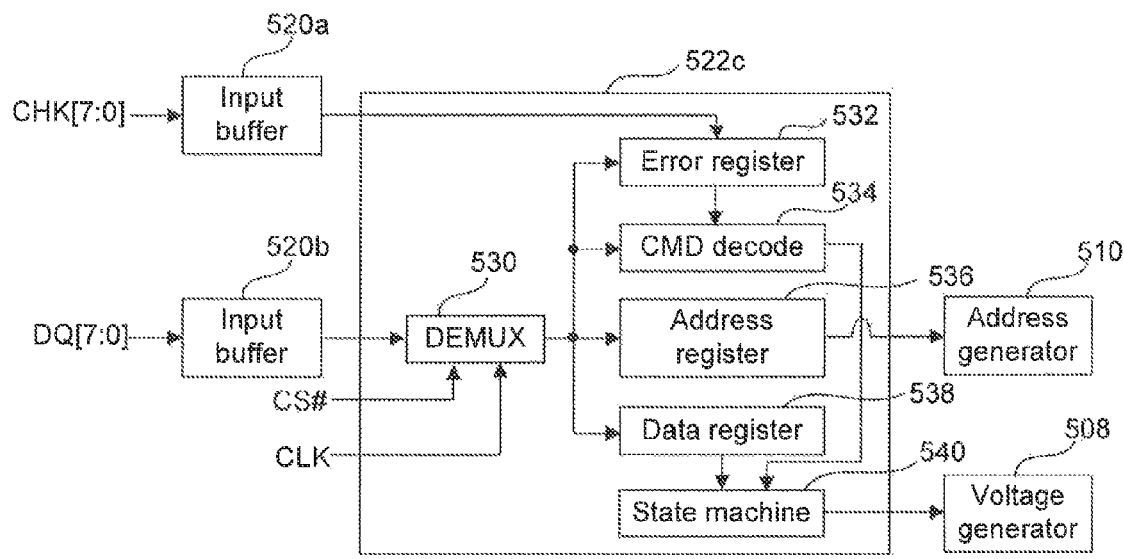
Figure 9C:
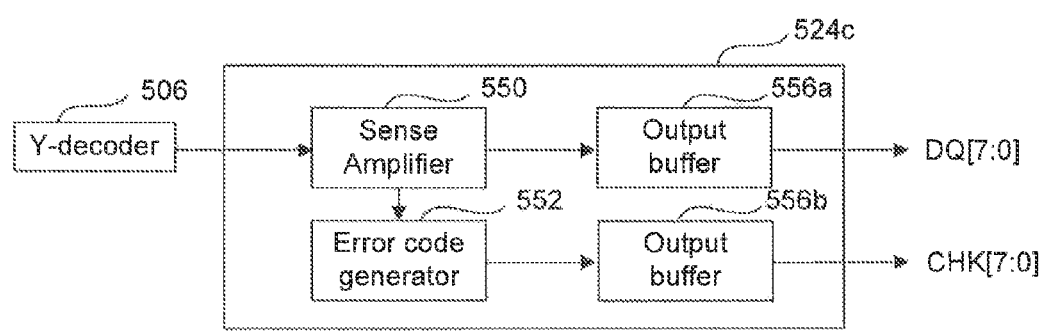

As shown in FIG. 9B, control logic 522c receives access control signal information from data bus DQ[7:0] and error detection signal information from an additional input corresponding to error detection bus CHK[7:0]. In some embodiments, error detection signal information is received from a first input buffer 520a, whereas access control signal information is received from a second input buffer 520b. Access control signal information received from data bus DQ[7:0] is demultiplexed and provided to corresponding components similar to the above embodiments. In this embodiment, however, error register 532 does not interface with the data bus DQ[7:0]. Instead, error register 532 includes an input associated with error detection bus CHK[7:0]. Error register 532 in this embodiment functions similar to that described above with respect to FIG. 5B. For example, error register 532 is configured to receive error detection signal information from error detection bus CHK[7:0] to verify the correctness of access control signal information received by memory device 220c on data bus DQ[7:0]. Similar to the embodiment described above with respect to FIG. 5B, error register 532 controls command decode circuitry 534 to either perform an operation in accordance with the received command, or ignore the command, based on whether the access control signal information was received correctly. Although not shown, control logic 522c of memory device 520c may include additional modifications such as providing an output of error register 532 to interface with an output multiplexer similar to that described above with respect to FIG. 7B, in order to provide an error status signal to memory controller 210.

Output multiplexer 524c of memory device 520c includes similar components configured to perform similar functionality as those described above with respect to output multiplexer 524a shown in FIG. 5C. Output multiplexer 524c includes two output buffers 556a and 556b for outputting access control signal information and error detection signal information, respectively, on data bus DQ[7:0] and error detection bus CHK[7:0]. The additional output buffer 556b is configured to output an exemplary error detection signal to error detection bus CHK[7:0] for output to memory controller 210 separate from the access control signal information, as shown in FIG. 8A. The exemplary error detection signal includes read data error detection code "D CHK" 419 generated based on read data bits 418, as shown in FIG. 8A and as similarly described above with respect to FIG. 5C. As similarly described above, in another embodiment, output multiplexer 524c may be further modified to include an error status generator and a third output buffer for generating and outputting an error status signal on error output pin ERR#229.

Figure 10A:
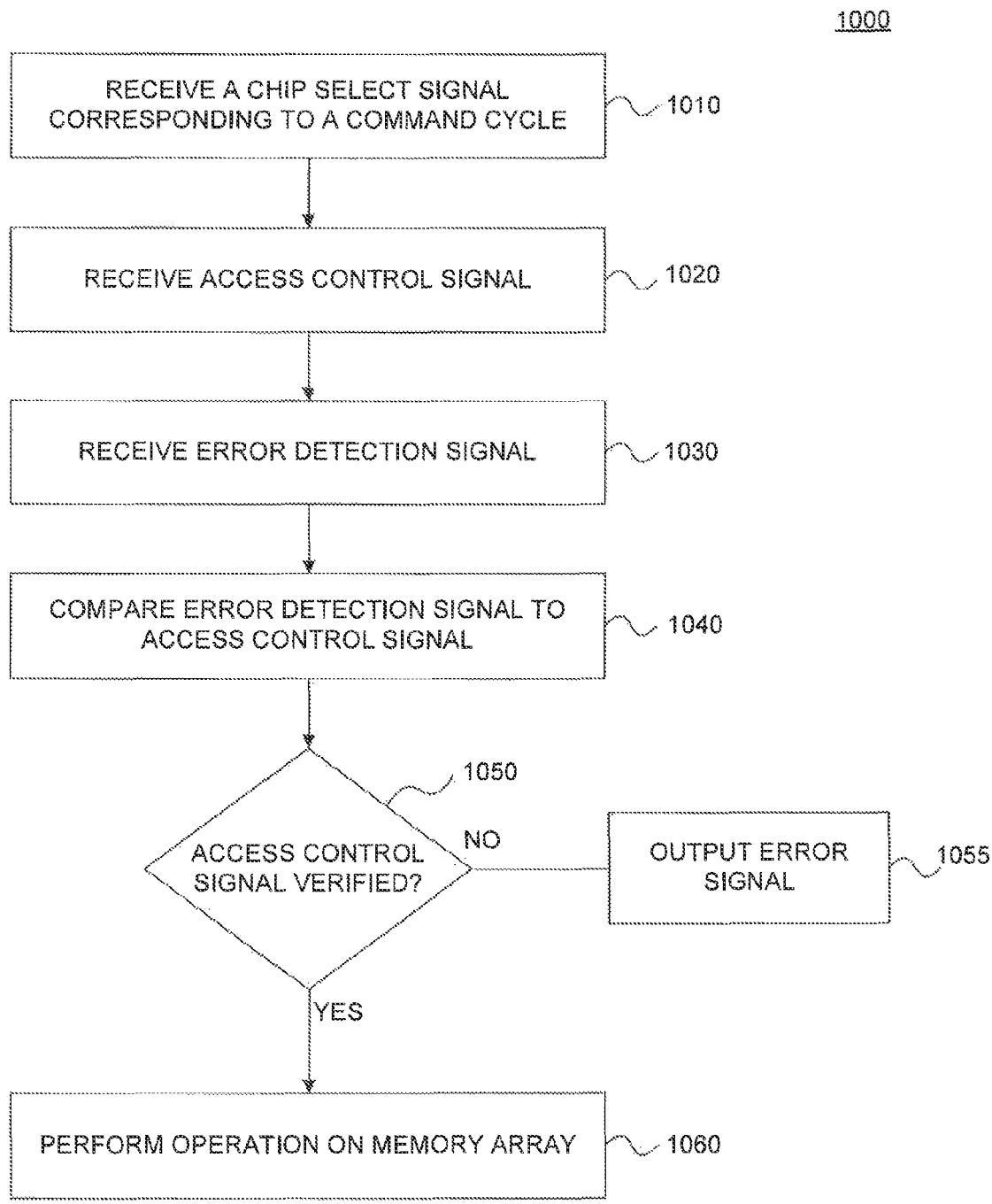
FIGS. 10A and 10B, together, are a flow chart showing a process performed by a memory device for implementing the exemplary communication protocols according to the disclosed embodiments.
Figure 10B:
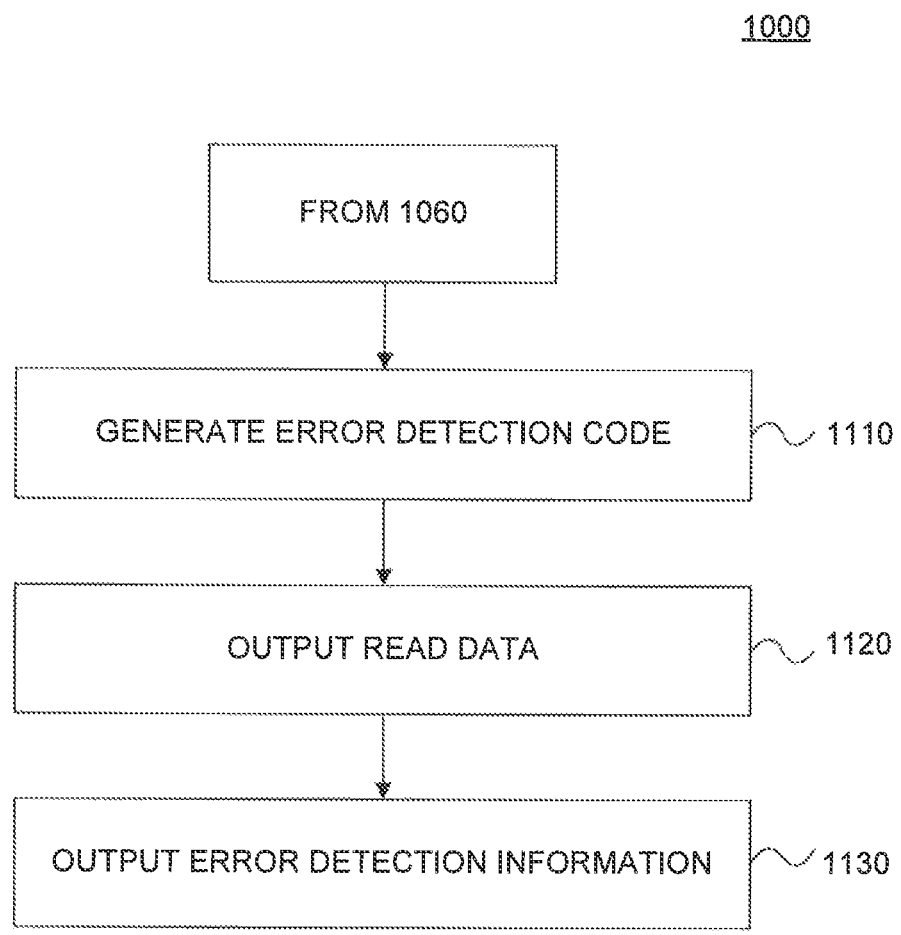

The memory devices of the exemplary embodiments described above with respect to FIGS. 5A, 7A, and 9A are generally configured to perform access control operations on a memory array according to the exemplary read and write protocols of the disclosed embodiments. FIGS. 10A and 10B together illustrate a flowchart 1000 describing a process 1000 corresponding to operation of an exemplary memory device according to the disclosed embodiments.

At 1010, memory device 220 receives a chip select signal from memory controller 210. The chip select signal activates memory device 220 to perform an operation and enables communications between memory controller 210 and memory device 220. Receipt of the chip select signal at 1010 indicates the beginning of a command cycle according to the disclosed embodiments. During the command cycle, memory device 220 receives the access control signal (1020) from memory controller 210. An exemplary access control signal may include access control signal information according to any of the protocols described with respect to FIGS. 4A, 4B, 6A, 6B, 8A or 8B or other protocols contemplated by the present disclosure. Additionally, at 1030, memory device 220 receives an error detection signal including error detection signal information also according to any of the protocols described with respect to FIGS. 4A, 4B, 6A, 6B, 8A or 8B or other protocols contemplated by the present disclosure. According to the exemplary embodiments, the received access control signal information and error detection signal information may be received in a time multiplexed manner over a shared input/output data bus DQ[7:0], or alternatively, they may be received simultaneously on distinct data buses, such as input/output data bus DQ[7:0] and input/output error detection bus CHK[7:0].

According to the disclosed embodiments, memory device 220 compares the received error detection signal information to received access control signal information (1040) and verifies whether the access control signal information was received correctly (1050). If the access control signal information is verified (1050: YES), memory device 220 performs an operation according to the received command information provided in the access control signal information (1060). Alternatively, if the access control signal information was not received correctly, or the accuracy could otherwise not be verified (1050: NO), memory device 220 outputs an error signal to memory controller 210 (1055).

If the received command information from memory controller 210 indicates performance of a read operation, exemplary memory device 220 according to the disclosed embodiments performs an exemplary read protocol. The read operation begins by sensing read data stored in a memory array during a read operation performed at 1060. At 1110, memory device 220 generates an error detection code based on the read data. The error detection code includes a plurality of error detection bits that may be used by memory controller 210 to verify the correctness of read data received from memory device 210. Memory device 220 then outputs the read data to memory controller 210 at 1120. Additionally, memory device 220 outputs error detection information corresponding to the generated error detection code (1130). According to the disclosed embodiments, read data may be output in a time multiplexed manner over a shared input/output data bus DQ[7:0], or alternatively, the read data may be output simultaneously on distinct data buses, such as input/output data bus DQ[7:0] and input/output error detection bus CHK[7:0].

Specific details of the particular operations of flowchart 1000 that have been described above are understood to be implemented in the exemplary processes described herein, and have been omitted for conciseness.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A memory device configured to implement an error detection protocol, the memory device comprising:
a memory array;
a first input for receiving a control signal corresponding to a command cycle;
a second input for receiving an access control signal during the command cycle and for receiving an error detection signal during the command cycle, wherein the error detection signal includes information corresponding to the access control signal;
control logic configured to verify the correctness of the access control signal by a comparison with the error detection signal, and to perform an operation on the memory array during the command cycle when the correctness of the access control signal is verified;
an error code generator circuit configured to generate error detection information corresponding to read data information requested by a controller as part of a read operation, the read data information including read data from the memory array; and
an output for providing the read data information and the error detection information to the controller during the command cycle.

2. The memory device of claim 1, wherein the second input is provided for coupling to a shared data bus between the controller and the memory device.

3. The memory device of claim 2, wherein the second input is configured to receive a plurality of command information bits provided in the access control signal, and a plurality of command error detection bits provided in the error detection signal, and further wherein the second input is configured to receive the plurality of command information bits successively followed by the plurality of command error detection bits.

4. The memory device of claim 1, wherein the second input is provided for coupling to an error detection bus dedicated to communicating the error detection signal between the controller and the memory device.

5. The memory device of claim 1, wherein the output is shared with the second input.

6. The memory device of claim 1, wherein the output is configured to output the error detection information in a time multiplexed manner with the read data information.

7. The memory device of claim 1, further comprising a second output for providing an error status signal to the controller based on a result of the comparison performed by the control logic.

8. A memory system comprising:
a controller for controlling read and write operations on a memory array of a memory device, the controller being configured to:
provide an access control signal, to the memory device, including command information indicating an operation to be performed on the memory array, and address information indicating an address at which the operation is to be performed;
generate an error detection signal including a plurality of command error detection bits corresponding to the command information and a plurality of address error detection bits corresponding to the address information; and
provide the error detection signal to the memory device; and
the memory device comprising:
an input for receiving the access control signal and for receiving the error detection signal;
control logic configured to verify the correctness of the access control signal by a comparison with the error detection signal, and to perform an operation on the memory array when the correctness of the access control signal is verified;
an error code generator circuit configured to generate error detection information corresponding to read data information requested by a controller as part of a read operation, the read data information including read data from the memory array; and
an output for providing the read data information and the error detection information to the controller during a command cycle associated with the read operation.

9. A method for implementing an error detection protocol by a memory device, the method comprising:
receiving a chip select signal corresponding to a command cycle;
receiving an access control signal and an error detection signal during the command cycle, wherein the error detection signal includes information corresponding to the access control signal;
comparing the error detection signal with the access control signal to determine that the received access control signal is correct;
performing a read operation on a memory array during the command cycle based on the access control signal;
generating an error detection code for read data read from the memory array; and
outputting the read data and a second error detection signal during the command cycle, wherein the second error detection signal includes information corresponding to the error detection code.

10. The method of claim 9, further comprising receiving the access control signal and the error detection signal in a time multiplexed manner.

11. A memory device, comprising:
a first input for receiving an access signal;
a second input for receiving a detection signal;
control logic configured to control the access signal when the detection signal is provided to the memory;
an error code generator circuit configured to generate error detection information corresponding to read data information requested by a controller as part of a read operation, the read data information including read data from a memory array of the memory device; and
an output for providing the read data information and the error detection information to the controller during a command cycle associated with the read operation.

* * * * *